(12) United States Patent
Karplus et al.

(10) Patent No.: US 11,860,249 B2
(45) Date of Patent: *Jan. 2, 2024

(54) MOTOR AND ROTARY TRANSFORMER WITH SHARED MAGNETIC CORE

(71) Applicant: WAYMO LLC, Mountain View, CA (US)

(72) Inventors: Paul Thomas Hansen Karplus, Redwood City, CA (US); Samuel Lenius, Palo Alto, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,112

(22) Filed: Oct. 6, 2022

(65) Prior Publication Data

US 2023/0029499 A1 Feb. 2, 2023

Related U.S. Application Data

(63) Continuation of application No. 16/692,291, filed on Nov. 22, 2019, now Pat. No. 11,506,731.
(Continued)

(51) Int. Cl.
*H02K 1/22* (2006.01)
*G01R 33/07* (2006.01)
(Continued)

(52) U.S. Cl.
CPC .......... *G01R 33/072* (2013.01); *G01S 7/4811* (2013.01); *H01F 38/18* (2013.01);
(Continued)

(58) Field of Classification Search
CPC ........ H02K 24/00; H02K 11/33; H02K 11/21; H02K 3/28; H02K 11/24; H02K 11/27; H02K 11/26; H02K 1/22; H02K 1/2786; H02K 1/146; H02K 1/187; H02K 11/215; H01F 38/18; G01R 33/091; G01R 33/072; G01S 7/4811
See application file for complete search history.

(56) References Cited

U.S. PATENT DOCUMENTS 6,950,633 B2 9/2005 Kojima et al.
7,352,929 B2 4/2008 Hagen et al.
(Continued)

OTHER PUBLICATIONS

Deublin, Engineered for Performance, The Basics of Electrical Slip Rings, www.deublin.com,Mar. 5, 2018, pp. 1-11.
(Continued)

*Primary Examiner* — Leda T Pham
(74) *Attorney, Agent, or Firm* — Botus Churchill IP Law LLP

(57) ABSTRACT

An integrated hybrid rotary assembly is configured to provide power, torque and bi-directional communication to a rotatable sensor, such as a lidar, radar or optical sensor. A common ferrite core is shared by a motor, rotary transformer and radio frequency communication link. This hybrid configuration reduces cost, simplifies the manufacturing process, and can improve system reliability by employing a minimum number of parts. The assembly can be integrated with the sensor unit, which may be used in vehicles and other systems.

20 Claims, 13 Drawing Sheets

Related U.S. Application Data

(60) Provisional application No. 62/771,685, filed on Nov. 27, 2018.

(51) Int. Cl.
| | |
|---|---|
| *H01F 38/18* | (2006.01) |
| *G01S 7/481* | (2006.01) |
| *H02K 11/215* | (2016.01) |
| *H02K 1/18* | (2006.01) |
| *H02K 1/14* | (2006.01) |
| *H02K 1/2791* | (2022.01) |

(52) U.S. Cl.
CPC ............ *H02K 1/146* (2013.01); *H02K 1/187* (2013.01); *H02K 1/22* (2013.01); *H02K 1/2791* (2022.01); *H02K 11/215* (2016.01); *H02K 2211/00* (2013.01)

(56) References Cited

U.S. PATENT DOCUMENTS

| | | |
|---|---|---|
| 7,969,558 B2 | 6/2011 | Hall |
| 8,767,190 B2 | 7/2014 | Hall |
| 9,059,649 B1 | 6/2015 | Droz et al. |
| 9,425,654 B2 | 8/2016 | Lenius et al. |
| 9,453,737 B2 | 9/2016 | Nickolaou et al. |
| 9,628,170 B1 | 4/2017 | Rosenband et al. |
| 9,793,046 B2* | 10/2017 | Rozman ............... H01F 27/2804 |
| 9,823,659 B2 | 11/2017 | Holmberg et al. |
| RE46,672 E | 1/2018 | Hall |
| 9,882,433 B2 | 1/2018 | Lenius et al. |
| 9,979,061 B1 | 5/2018 | Droz et al. |
| 10,256,758 B2* | 4/2019 | Frampton ................. H02P 9/04 |
| 11,506,731 B2* | 11/2022 | Karplus ................. H01F 38/18 |
| 2010/0020306 A1 | 1/2010 | Hall |
| 2015/0115762 A1* | 4/2015 | Rozman ................. H01F 38/18 336/123 |
| 2017/0025931 A1 | 1/2017 | Endo et al. |
| 2018/0017680 A1 | 1/2018 | Pennecot et al. |
| 2018/0057006 A1 | 3/2018 | Seki et al. |
| 2020/0166589 A1 | 5/2020 | Karplus et al. |

OTHER PUBLICATIONS

Spinner Air Traffic Control Rotary Joints, High Frequency Performance Worldwide, www.spinner-group.com, 2013, pp. 1-38.
U.S. Appl. No. 16/235,294, filed Dec. 28, 2018.

* cited by examiner

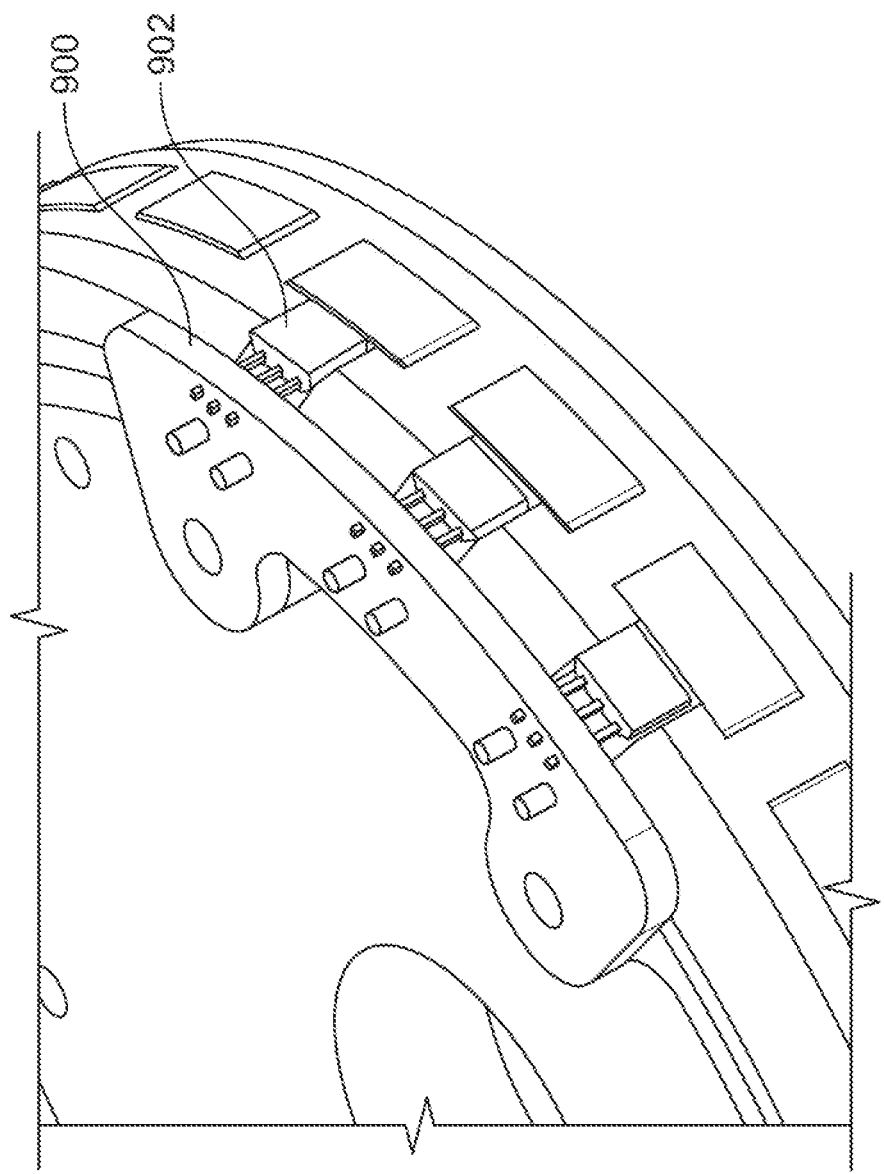

MOTOR AND ROTARY TRANSFORMER WITH SHARED MAGNETIC CORE

CROSS-REFERENCE TO RELATED APPLICATIONS

The present application is a continuation of U.S. application Ser. No. 16/692,291, filed Nov. 22, 2019, which claims the benefit of the filing date of U.S. Provisional Application No. 62/771,685, filed Nov. 27, 2018, the entire disclosures of which are incorporated by reference herein.

BACKGROUND

Rotating sensor assemblies are used in many applications and situations. For instance, a vehicle may be capable of driving in autonomous modes, manual modes or both autonomous and manual modes. In order to operate in an autonomous mode or assist the driver in a manual mode, sensors such as radar, camera and lidar are employed. These sensors may be rotatable, such as to provide a 360 degree field of view of the environment surrounding the vehicle.

A slip ring and a motor can provide power, transmit information and supply torque to a rotating sensor assembly. However, these are separate components that are each susceptible to wear and tear, and potentially breaking down. Alternatively, a separate motor and rotary transformer may be used. Here, the motor produces torque to spin the rotating assembly, while the transformer and a winding transfer power and communication signals, respectively. As with the slip ring and motor, this approach involves multiple components. Cost, size, reliability, maintenance and other issues may impact the type of rotary mechanisms that are employed.

BRIEF SUMMARY

A challenge with rotatable sensors is to effectively transfer power, torque and data through a rotary joint. Aspects of the disclosure provide an integrated architecture that employs a shared magnetic core. This type of assembly is streamlined structurally. By sharing the magnetic core between the motor, transformer and communication link, the number of components is significantly reduced, which can provide other benefits such as streamlined manufacturing, lower cost components and higher reliability.

According to one aspect, a hybrid rotary sensor assembly is provided. The assembly comprises a sensor unit configured to rotate about an axis and a motor unit operatively coupled to the sensor unit. The motor unit includes a ferrous stator and a rotor. The rotor encircles the stator and is configured to rotate about the axis. The stator has a central opening aligned along the axis and a plurality of teeth arranged along an exterior edge opposite the central opening. Each of the teeth has wire wound therealong. A first side of the stator includes a rotary transformer coil disposed thereon. A radio frequency (RF) communication element is disposed on the stator adjacent to the central opening. The motor unit is configured to rotate the sensor unit about the axis and the RF communication element is configured to transmit or receive RF signals used for data communication by the sensor unit.

In one example, the teeth are straight and the wound wire for each tooth is configured as a pre-wound bobbin slidably inserted onto the tooth. In another example, the rotary transformer coil includes between 5-10 turns coiled on the first side of the stator. Here, the RF communication element may comprise a wire coiled between 1-3 turns adjacent to the central opening.

In a further example, the sensor unit is a lidar sensor unit. In another example, the sensor unit is a radar sensor unit or a camera sensor unit. And in yet another example, the sensor unit includes one or more of a lidar sensor unit, a radar sensor unit, and a camera sensor unit.

The hybrid rotary sensor assembly may further comprise one or more Hall Effect sensors affixed to the stator. In this case, the one or more Hall Effect sensors may be digital sensors or 3 axis analog sensors.

The stator of the hybrid rotary sensor assembly may be formed as a unitary ferrite molded element. The first side of the stator may include a receptacle region arranged between the central opening and the exterior edge. Here, the rotary transformer coil may be disposed in the receptacle region.

According to another aspect, a combination motor and rotary assembly is configured to provide power, torque and data to a rotatable sensor unit. The assembly comprises a magnetic stator and a rotor. The magnetic stator has a central opening arranged perpendicular to an axis of rotation for the rotatable sensor component. A plurality of teeth are arranged along an exterior edge opposite the central opening. A receptacle region is disposed on a first side of the stator between the central opening the plurality of teeth. The rotor encircles the stator and is configured to rotate about the axis relative to the stator. Each of the teeth has wire wound therealong. The first side of the stator includes a rotary transformer coil disposed in the receptacle region. A radio frequency (RF) communication element is disposed on the stator adjacent to the central opening. The assembly is configured to rotate the sensor unit about the axis, the transformer coil is configured to provide power to the sensor unit, and the RF communication element is configured to transmit or receive RF signals used for data communication by the sensor unit.

In one example, the teeth are straight and the wound wire for each tooth is configured as a pre-wound bobbin slidably inserted onto the tooth. The teeth may be flared.

The rotary transformer coil may include between 5-10 turns coiled on the first side of the stator in the receptacle region. Here, the RF communication element may comprise a wire coiled between 1-3 turns adjacent to the central opening.

In another example, the combination motor and rotary assembly further comprises one or more Hall Effect sensors affixed to the stator. The stator may be formed as a unitary ferrite molded element.

A method of fabricating an assembly is provided according to a further aspect of the technology. The method comprises forming a unitary stator and transformer structure from a ferrous material, the unitary structure having a central opening, a plurality of teeth arranged along an exterior edge opposite the central opening, and a receptacle region disposed on a first side of the structure between the central opening the plurality of teeth; applying a set of bobbin assemblies to the plurality of teeth, each of the teeth receiving one of the set of bobbin assemblies, each bobbin assembly including wiring wound around a given tooth and an insulating material disposed between the wiring and the given tooth; disposing a transformer in the receptacle region, the transformer comprising wiring being wound to encircle the central opening, the transformer configured to supply power to a rotatable sensor device; and disposing a communication link component adjacent to the central opening, the communication link being configured to transmit or receive RF signals used for data communication with the rotatable sensor device.

The method may further comprise potting the assembly with a potting compound; affixing one or more Hall Effect sensors adjacent to one or more of the teeth; and encircling the assembly with a rotor configured to rotate about an axis relative to the assembly.

BRIEF DESCRIPTION OF THE DRAWINGS

FIG. 9 illustrates a stator assembly with mounted Hall Effect sensors in accordance with aspects of the disclosure.

DETAILED DESCRIPTION

Overview

The technology relates to rotating sensors such as lidars, scanning radars, cameras and the like, which may be employed with self-driving vehicles and other equipment. An integrated hybrid rotary assembly provides for sensor rotation, in which a single ferrite molded core is shared by a motor, rotary transformer and RF communication link. This hybrid configuration reduces cost, simplifies the manufacturing process, and can improve system reliability with fewer parts. By way of example, the RF link may operate at between 2-50 MHz, up to 100 MHz or more, etc.

Figure 1:
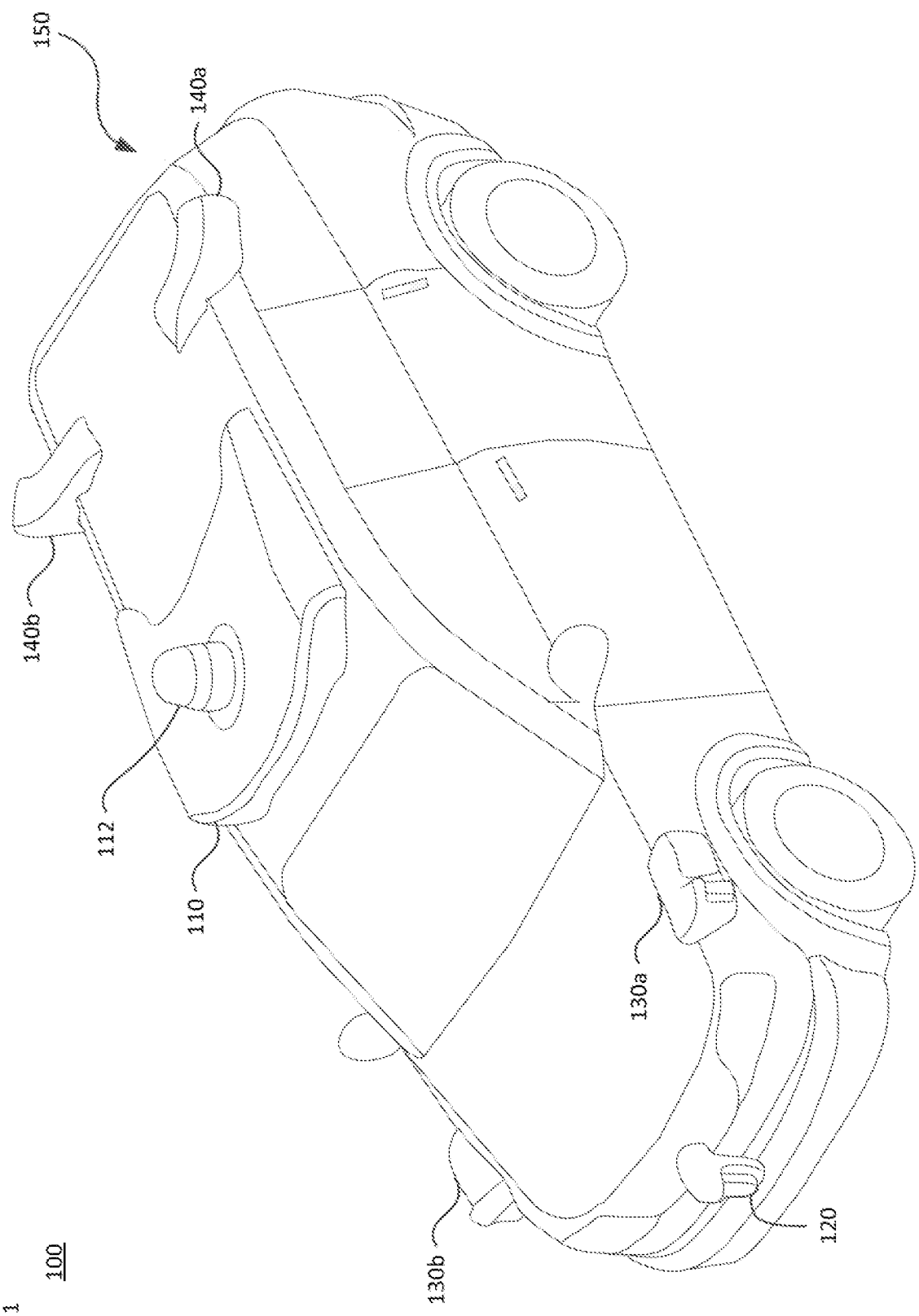
FIG. 1 illustrates an example vehicle in accordance with aspects of the disclosure.

FIG. 1 is a perspective view of an exemplary vehicle 100, which may operate in autonomous and/or manual driving modes. As shown, the vehicle 100 includes various sensors for obtaining information about the vehicle's external environment. For instance, a roof-top housing 110 and dome arrangement 112 may include a lidar sensor as well as various cameras and/or radar units. Housing 120, located at the front end of vehicle 100, and housings 130a, 130b on the driver's and passenger's sides of the vehicle may each store a lidar and/or other sensor(s) such as cameras and radar units. For example, housing 130a may be located in along a quarter panel in front of the driver's side door. Vehicle 100 also includes housings 140a, 140b for radar units, lidar and/or cameras also located towards the rear roof portion of the vehicle. Additional lidar, radar units and/or cameras (not shown) may be located at other places along the vehicle 100. For instance, arrow 150 indicates that a sensor unit may be positioned along the rear of the vehicle 100, such as on or adjacent to the bumper.

While certain aspects of the disclosure may be particularly useful in connection with specific types of vehicles, the vehicle may be any type including, but not limited to, cars, trucks, motorcycles, buses, recreational vehicles, etc. The technology may also be used with other systems and configurations that employ rotating sensors, such as robots, interior and exterior building sensors, etc.

Figure 2:
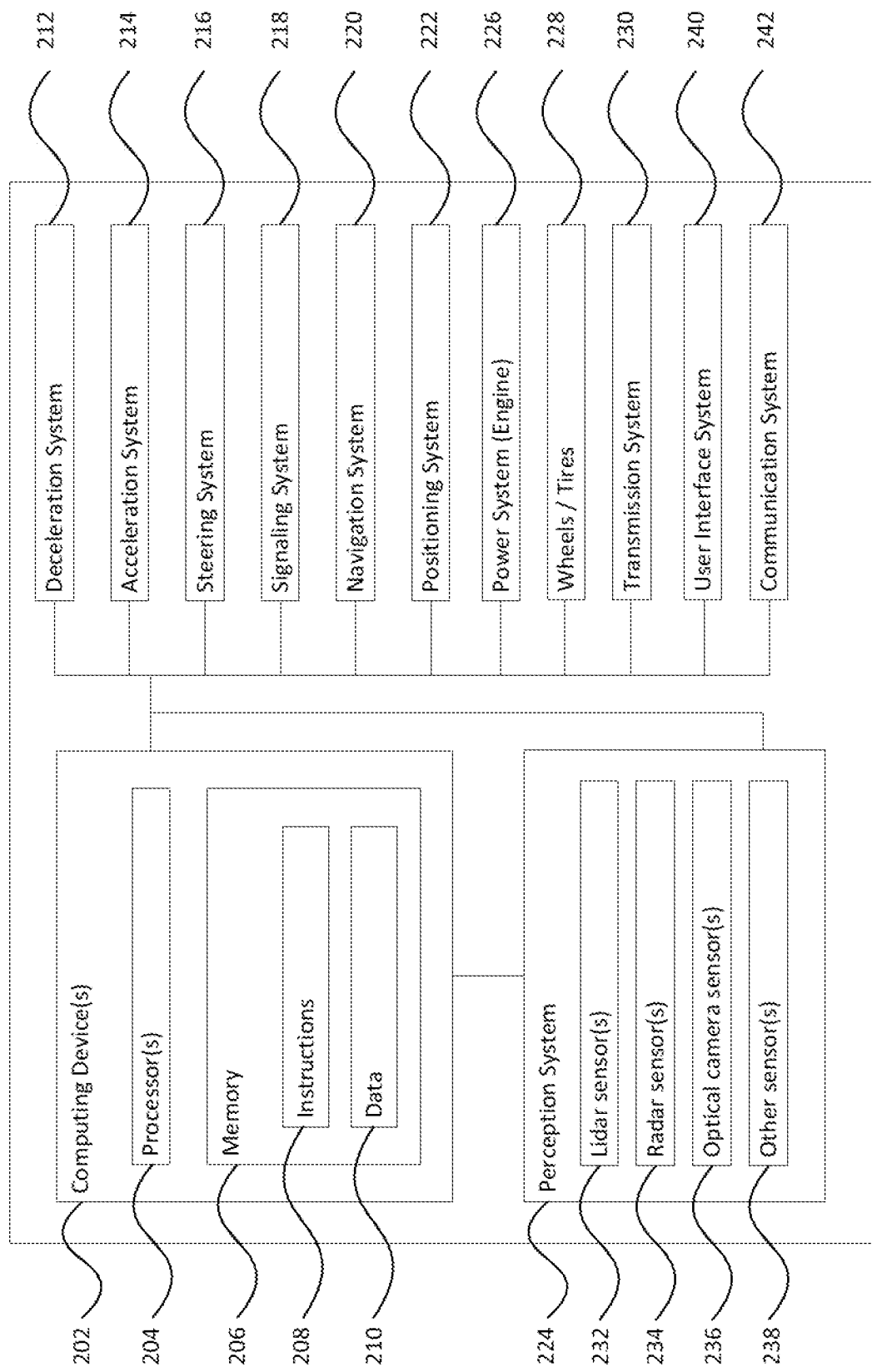
FIG. 2 is a functional diagram of an example vehicle in accordance with aspects of the disclosure.

FIG. 2 illustrates a block diagram 200 showing various systems and components of an example vehicle akin to vehicle 100. For instance, the vehicle 200 may have one or more computing devices, such as computing devices 202 containing one or more processors 204, memory 206 and other components typically present in general purpose computing devices.

The memory 206 stores information accessible by the one or more processors 204, including instructions 208 and data 210 that may be executed or otherwise used by the processor(s) 204. The memory 206 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 208 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. The data 210 may be retrieved, stored or modified by a given processor 204 in accordance with the instructions 208. For instance, although the claimed subject matter is not limited by any particular data structure, the data may be stored in computing device registers, in a relational database as a table having a plurality of different fields and records. XML documents or flat files. The data may also be formatted in any computing device-readable format.

The one or more processor 204 may be any conventional processors, such as commercially available CPUs. Alternatively, the one or more processors may be a dedicated device such as an ASIC or other hardware-based processor. Although FIG. 2 functionally illustrates the processor(s), memory, and other elements of computing device(s) 202 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 202. Accordingly, references to a processor or computing device will be understood to include references to a collection of processors or computing devices or memories that may or may not operate in parallel, or which may have a distributed architecture.

In one example, computing devices 202 may be control computing devices of an autonomous driving computing system or incorporated into vehicle 100 of FIG. 1. The autonomous driving computing system may be capable of communicating with various components of the vehicle in order to control the movement of vehicle 100 according to primary vehicle control code of memory 206. For example, computing devices 202 may be in communication with various systems of vehicle 100, such as deceleration system 212, acceleration system 214, steering system 216, signaling system 218, navigation system 220, positioning system 222, perception system 224, power system 226 (e.g., the vehicle's engine or motor) and transmission system 228 in order to control the movement, speed, etc. of vehicle 100 in accordance with the instructions 208 of memory 206. The wheels/tires 230 may be controlled directly by the computing devices 202 or indirectly via these other systems. Again, although these systems are shown as external to computing devices 202, in actuality, these systems may also be incorporated into computing devices 202, again as an autonomous driving computing system for controlling vehicle 100.

As an example, computing devices 202 may interact with one or more actuators of the deceleration system 212 and/or acceleration system 214, such as brakes, accelerator pedal, and/or the engine or motor 226 of the vehicle, in order to control the speed of the vehicle. Similarly, one or more actuators of the steering system 216, such as a steering wheel, steering shaft, and/or pinion and rack in a rack and pinion system, may be used by computing devices 202 in order to control the direction of vehicle 100. For example, if vehicle 100 is configured for use on a road, such as a car or truck, the steering system may include one or more actuators to control the angle of wheels to turn the vehicle. Signaling system 218 may be used by computing devices 202 in order to signal the vehicle's intent to other drivers or vehicles, for example, by lighting turn signals or brake lights when needed.

Navigation system 220 may be used by computing devices 202 in order to determine and follow a route to a location. In this regard, the navigation system 220 and/or data 210 may store detailed map information, e.g., highly detailed maps identifying the shape and elevation of roadways, lane lines, intersections, crosswalks, speed limits, traffic signals, buildings, signs, real time traffic information, vegetation, or other such objects and information.

Positioning system 222 may be used by computing devices 202 in order to determine the vehicle's relative or absolute position on a map or on the earth. For example, the position system 222 may include a GPS receiver or other positioning component to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise than absolute geographical location.

The positioning system 222 may also include other devices in communication with computing devices 202, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing devices 202, other computing devices and combinations of the foregoing.

The perception system 224 also includes one or more components for detecting objects external to the vehicle such as other vehicles, obstacles in the roadway, traffic signals, signs, trees, etc. For example, the perception system 224 may include lasers (lidar) 232, radar 234, cameras 236 (e.g., optical or infrared) and/or any other detection sensors 238 that record data which may be processed by computing devices 202, such as sonar, microphones, etc. In the case where the vehicle is a passenger vehicle such as a minivan, the minivan may include lidar or other sensors mounted on the roof or other convenient locations as shown in FIG. 1. One or more sensors of the perception system 224 may be rotatable about an axis, for instance to provide a 360° field of view (or less). The perception system may be linked directly to the computing devices 202 via a dedicated bus and/or share a common communication bus with the other subsystems.

The computing devices 202 may control the direction and speed of the vehicle according to various operation modes which include autonomous driving by controlling various components. By way of example, computing devices 202 may navigate the vehicle to a destination location completely autonomously using data from the detailed map information and navigation system 220. Computing devices 202 may use the positioning system 222 to determine the vehicle's location and perception system 224 to detect and respond to objects when needed to reach the location safely. In order to do so, computing devices 202 may cause the vehicle to accelerate (e.g., by increasing fuel or other energy provided to the engine by acceleration system 214), decelerate (e.g., by decreasing the fuel supplied to the engine, changing gears, and/or by applying brakes by deceleration system 212), change direction (e.g., by turning the front or rear wheels of vehicle 100 by steering system 216), and signal such changes (e.g., by lighting turn signals of signaling system 218). Thus, the acceleration system 214 and deceleration system 212 may be a part of a drivetrain that includes various components between an engine of the vehicle and the wheels 228 of the vehicle, such as transmission system 230. Again, by controlling these systems, computing devices 202 may also control the drivetrain of the vehicle in order to maneuver the vehicle autonomously.

Computing devices 202 may include all of the components normally used in connection with a computing device such as the processor and memory described above as well as a user interface 240 (e.g., a mouse, keyboard, touch screen and/or microphone) and various electronic displays (e.g., a monitor having a screen or any other electrical device that is operable to display information). In this regard, an internal electronic display may be located within a cabin of vehicle 100 (not shown) and may be used by computing devices 202 to provide information to passengers within the vehicle 100.

Also shown in FIG. 2 is a communication system 242. The communication system 242 may also include one or more wireless network connections to facilitate communication with other computing devices, such as passenger computing devices within the vehicle, and computing devices external to the vehicle, such as in another nearby vehicle on the roadway, or a remote server system. The network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

Example Implementations

In addition to the structures and configurations described above, various implementation aspects will now be described.

Figure 3:
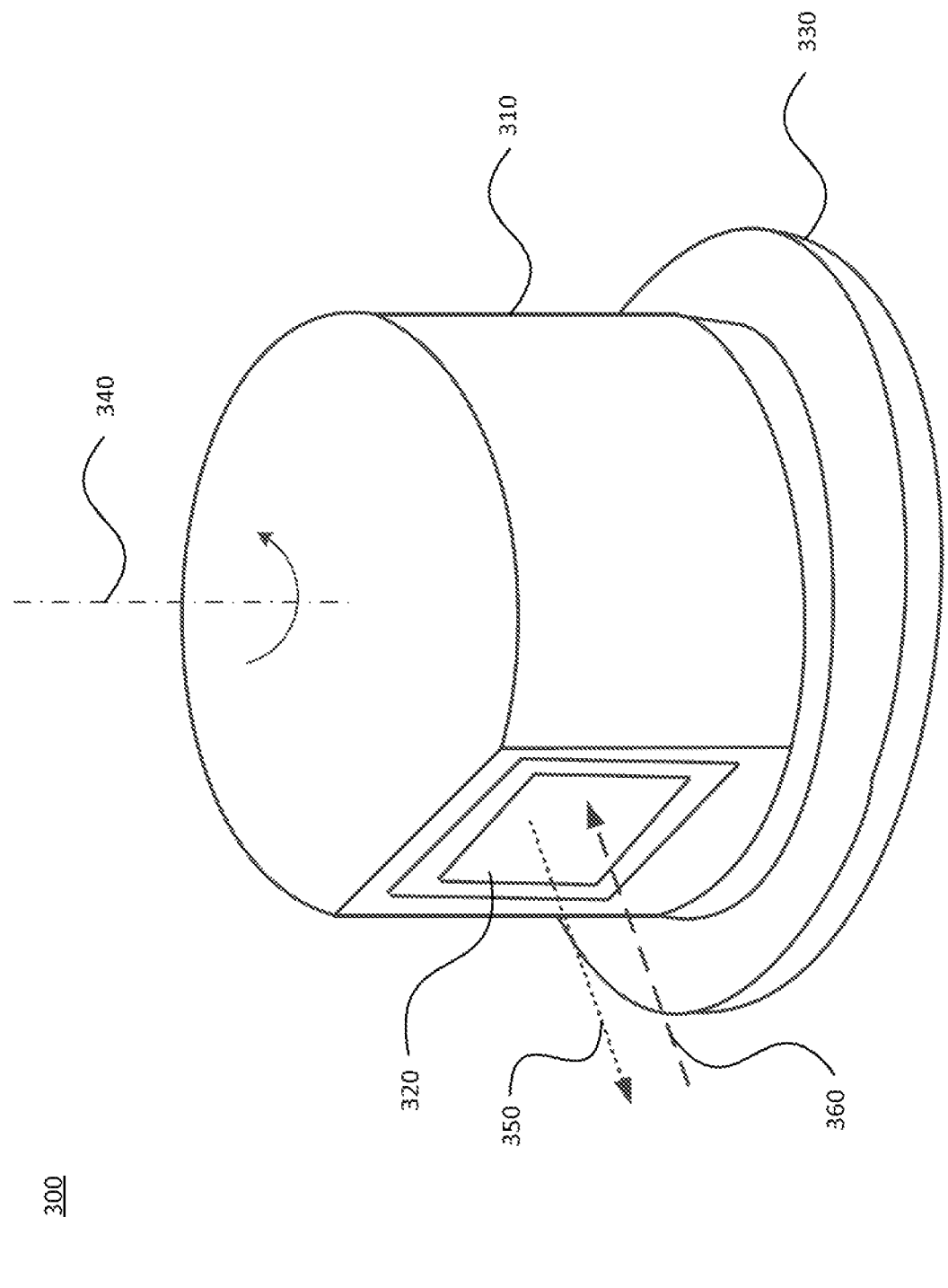
FIG. 3 is an example sensor assembly in accordance with aspects of the disclosure.

Turning first to FIG. 3, this figure illustrates a rotating sensor assembly 300 for use with the integrated architecture discussed herein. The rotating sensor assembly 300 may be a lidar sensor assembly, or may be a radar or camera sensor assembly, by way of example. As shown, the assembly 300 includes a housing 310 having a lens 320 disposed along a surface thereof. The housing 310 is rotatably coupled to a base 340, which may be affixed to a part of a vehicle (e.g., roof, quarter panel, front or rear bumper, etc.), or which may be part of the vehicle itself. The housing 310 and is configured to rotate about an axis 340, e.g., entirely about the axis 300 to provide a full panoramic 360° field of view, or less than a full panoramic view, e.g., between 1°-90° or 45°-180°. The axis may be in a vertical direction or otherwise perpendicular relative to the path of travel, may have a different angle, or be variable. In the case of a lidar sensor, as the housing 310 rotates one or more light beams 350 are emitted and exit the lens 320 to the environment external to the vehicle. Light reflected off of one or more objects in the environment return toward the lens 320 as reflected light 360. The received reflected light 360 may be processed by the perception system and/or by the computing devices of the vehicle.

In order to control and operate the rotating sensor assembly 300, electrical power, torque and control signals need to be supplied to it, and received data needs to be provided by the assembly to the perception system or other components. As noted above, the integrated architecture employs a magnetic core that is shared by a motor, rotary transformer and wireless communication link such as an RF communications link.

Figure 4A:
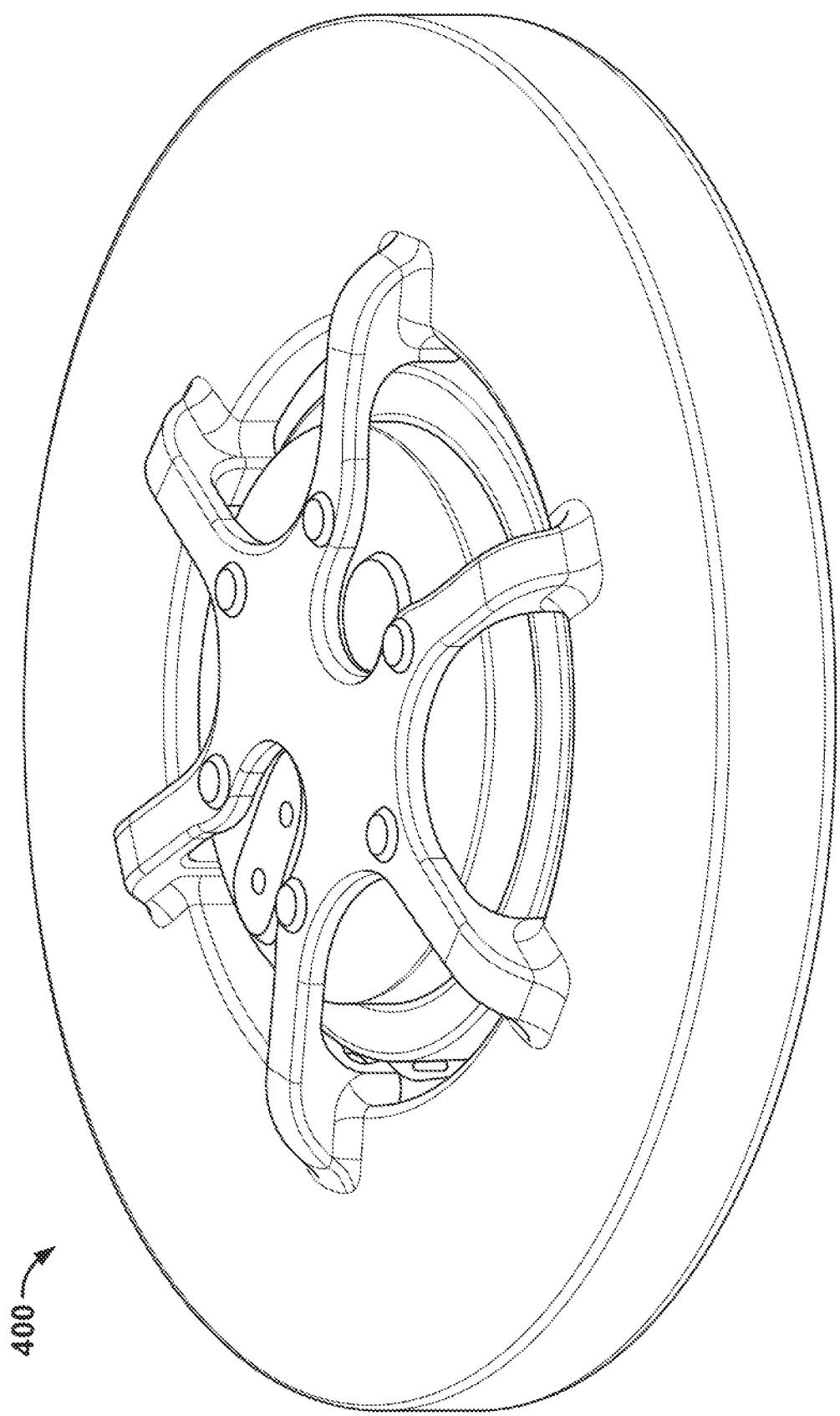
FIGS. 4A-B illustrate an example rotor assembly in accordance with aspects of the disclosure.
Figure 4B:
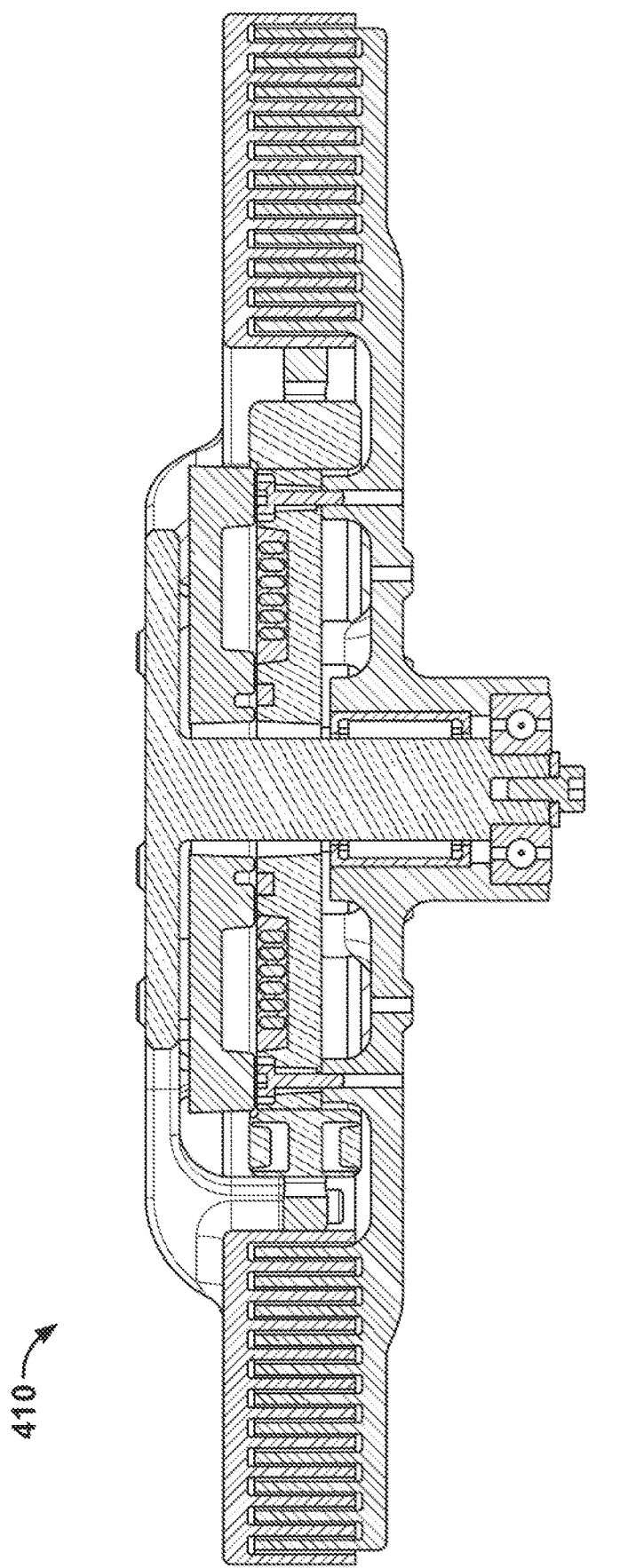
Figure 5C:
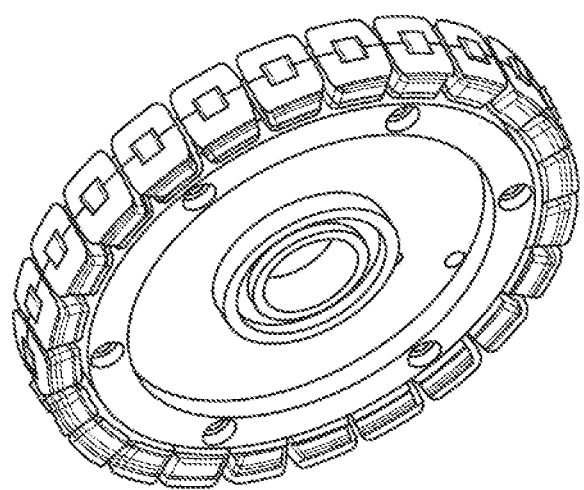
FIGS. 5A-C illustrate a first stator and transformer core and partial assembly in accordance with aspects of the disclosure.
Figure 5B:
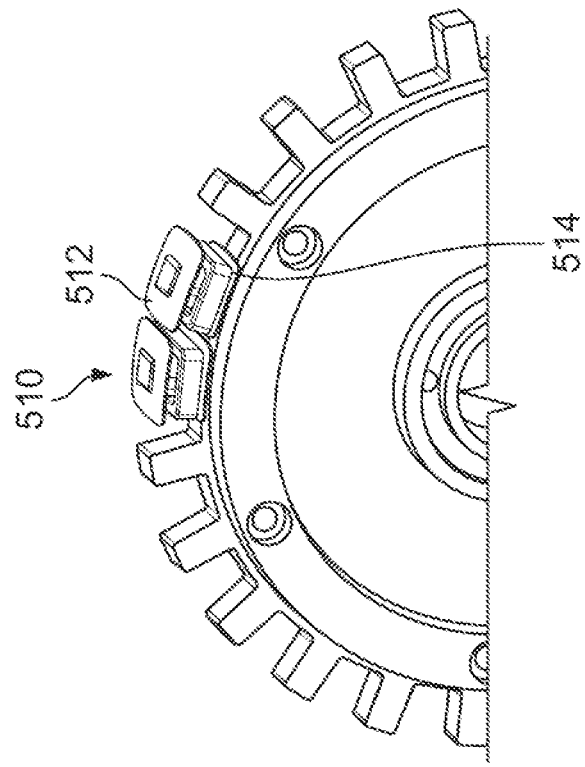
Figure 5A:
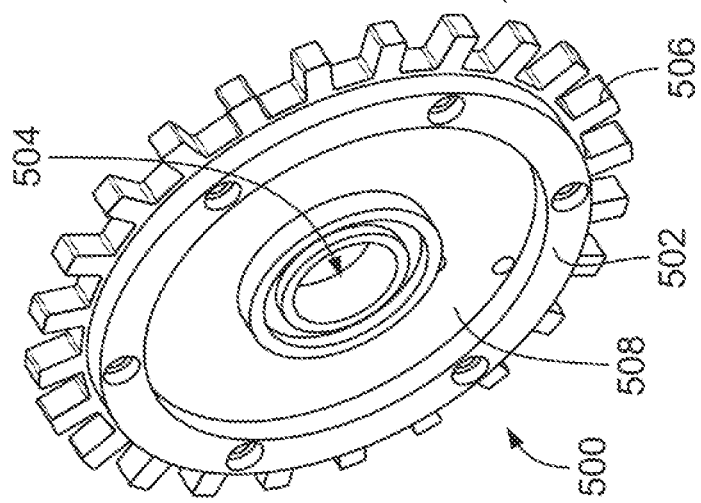

One example of a rotor assembly 400 according to aspects of the technology is shown in FIG. 4A, and a cutaway view 410 is shown in FIG. 4B. The rotor assembly may have different configurations and may be assembled in different ways depending on the type and arrangement of the sensor. For instance. FIGS. 5A-C illustrate a first core 500 having a circular body 502 with a central opening 504 and a series of teeth 506 extending from the circular body 502. In this example, the teeth 506 are straight (non-flared).

The core 500 is ferromagnetic, and is configured as both a stator backiron and transformer core. For instance, the core could be mostly iron and/or made of various ferrites as well as sintered powdered metal, which may contain more than 50% nickel. The central opening 504 is configured to fit a shaft, bearings and a communication link (not shown) such as an RF link. The circular body 502 also includes a receptacle region 508 disposed between the central opening 504 and the teeth 506. The receptacle region 508 may be circular as shown, or may have another configuration.

FIG. 5B illustrates a first assembly step, in which a set of bobbins assemblies 510 are placed on the teeth 506. Each bobbin assembly 510 includes a bobbin 512 of an insulating material (e.g., plastic) and motor wiring 514 wound around the bobbin 512. The bobbin assemblies 510 may be prewound and slid onto the teeth 506 of the stator core 500.

FIG. 5C illustrates the stator core 500 with bobbin assemblies 510 disposed on each of the teeth 506.

Figure 6B:
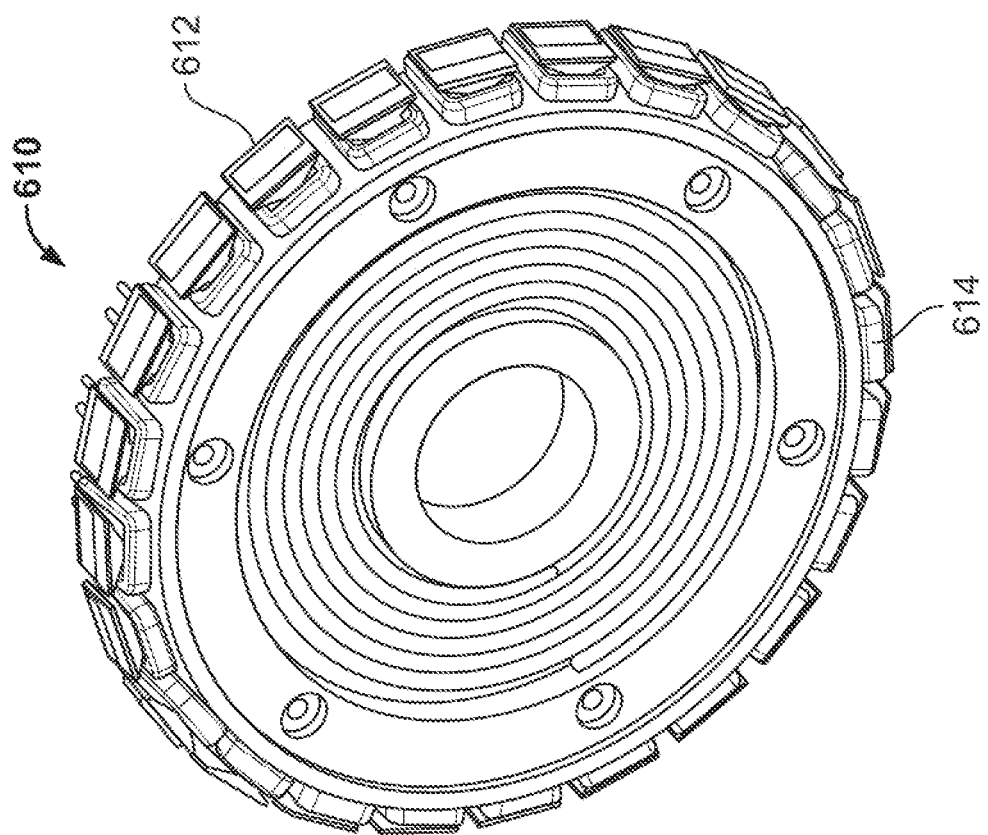
FIGS. 6A-B illustrate a second stator and transformer core and partial assembly in accordance with aspects of the disclosure.
Figure 6A:
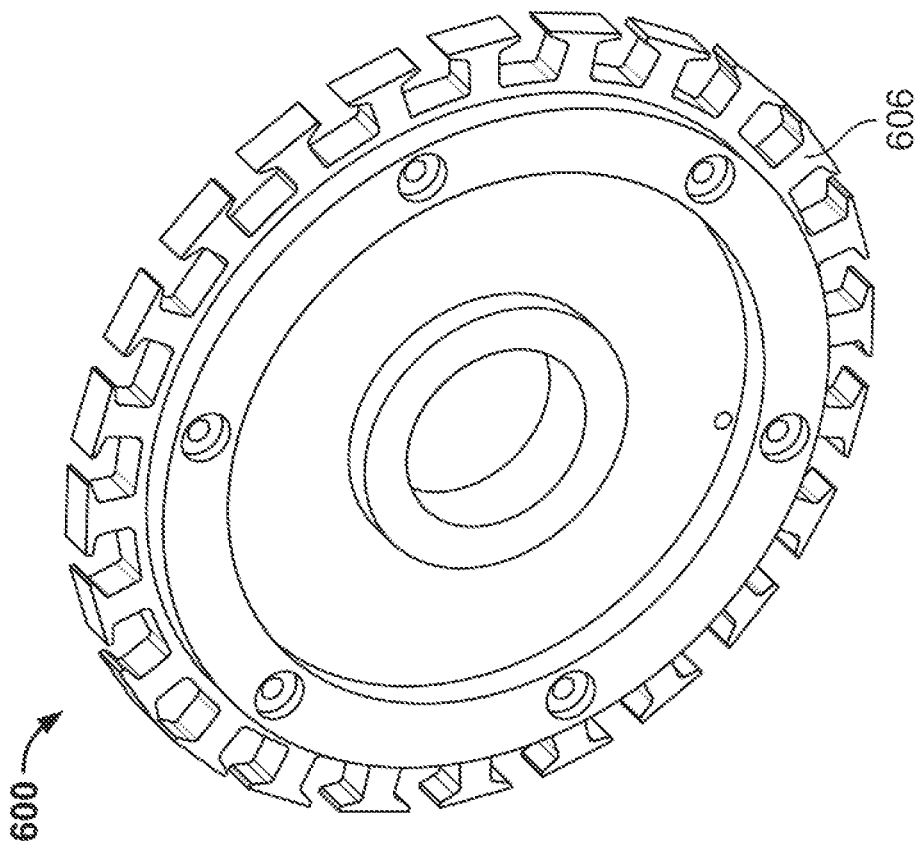

FIG. 6A illustrate an alternative stator and transformer core 600. As with the core 500, the core 600 is ferromagnetic, includes the central opening and the receptacle region. In this case, the core 600 includes a series of angled or otherwise flared teeth 606. The ferromagnetic core may be molded as a single piece out of ferrite powder. For instance, the core can be made from ferrite or other powdered moldable ferromagnetic powders. This can be accomplished with moldable or 3D printable ferromagnetic powder bearing plastics. The flared teeth 606 may provide for better motor efficiency; however, the straight teeth 506 may be easier to manufacture using the ferrite powder. As shown in FIG. 6B, bobbin assemblies 610 are affixed to each of the flared teeth. Here, bobbins 612 may be molded onto the flared teeth, and motor wiring 614 may be wound around the bobbins 612.

Figure 7B:
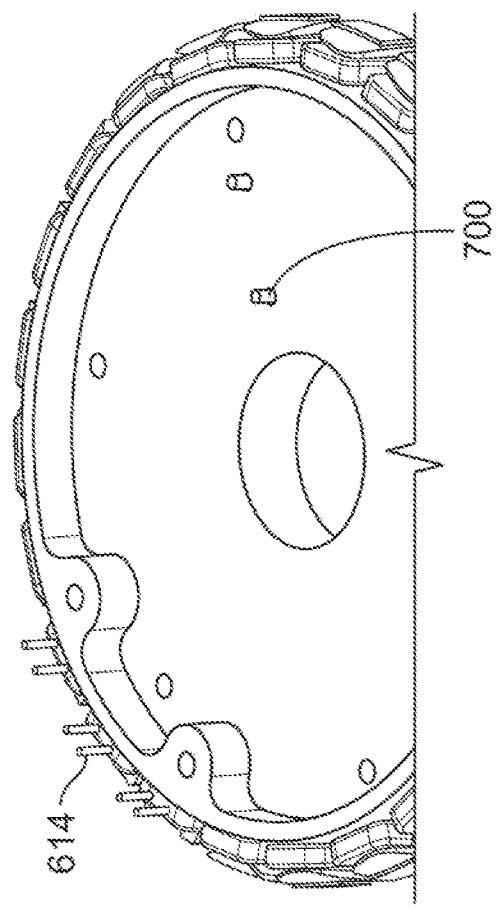
FIGS. 7A-B illustrates a core including transformer and communication link components in accordance with aspects of the disclosure.
Figure 7A:
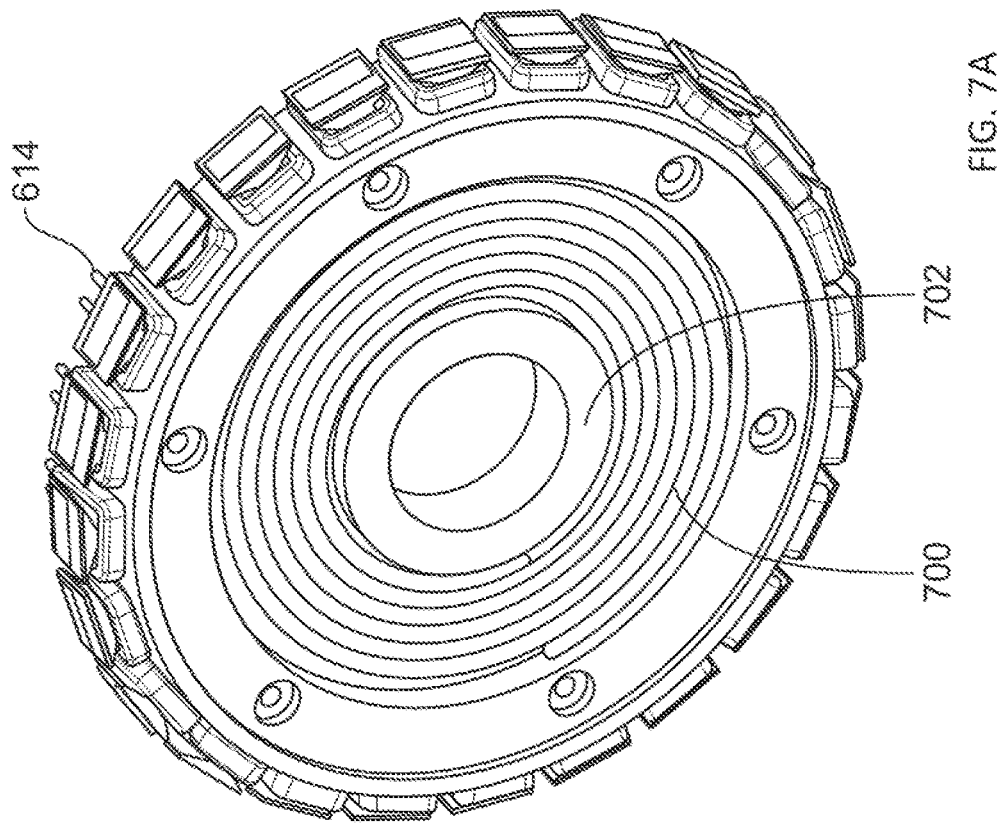

FIG. 7A shows a transformer 700 is disposed in the receptacle region. This figure also shows communication link 702 disposed along the central opening. The transformer 700 and the communication link 702 may each comprise a coiled wire. The gauge and number of windings may depend on the overall size of the rotor assembly, the amount of power being supplied, the communication frequency, etc. By way of example only, the transformer 700 may be formed of 8 or 10 gauge wire, having 6-10 turns in the winding. The communication link 702, such as to provide a radio frequency (RF) communication link, may be formed of 28-32 gauge wire, with only 1-2 turns. For each, thicker or thinner gauge wire may be used (e.g., 6-12 gauge or 24-40 gauge), and more or fewer turns may be employed (e.g., at least 3-4 turns or no more than 20-30 turns). The transformer may be prewound and inserted into the receptacle region. The wire for the communication link could be arranged as a freestanding coil, or may be wound on a bobbin and inserted into the central opening. And as shown in FIG. 7B, the ends of the wires 614 from the rotor assembly and from the transformer 700 can be positioned to extend away from the back side of the core.

Figure 8B:
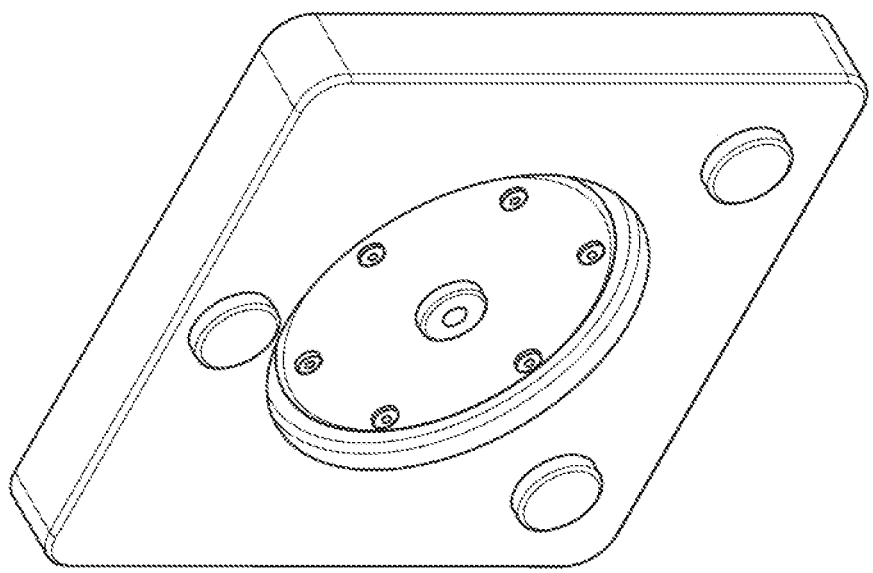
FIGS. 8A-F illustrate a process for potting the core in accordance with aspects of the disclosure.
Figure 8A:
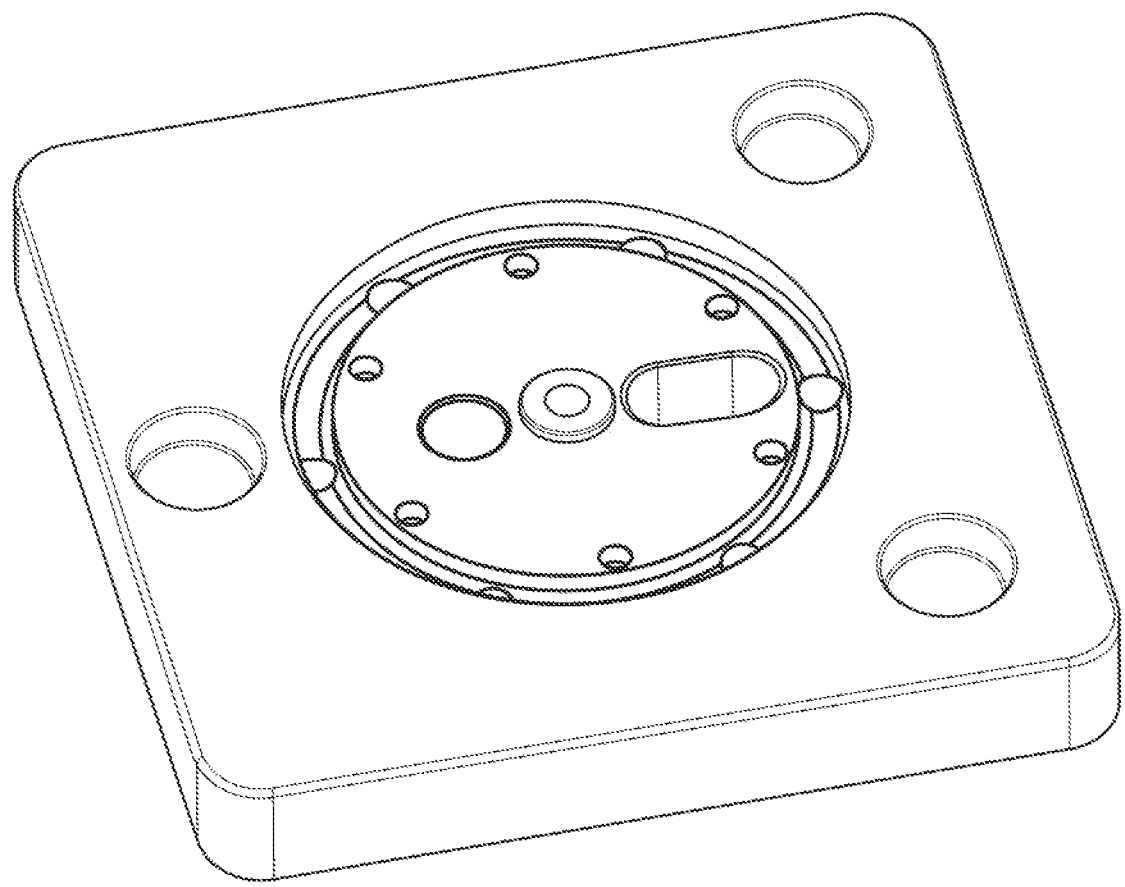
Figure 8D:
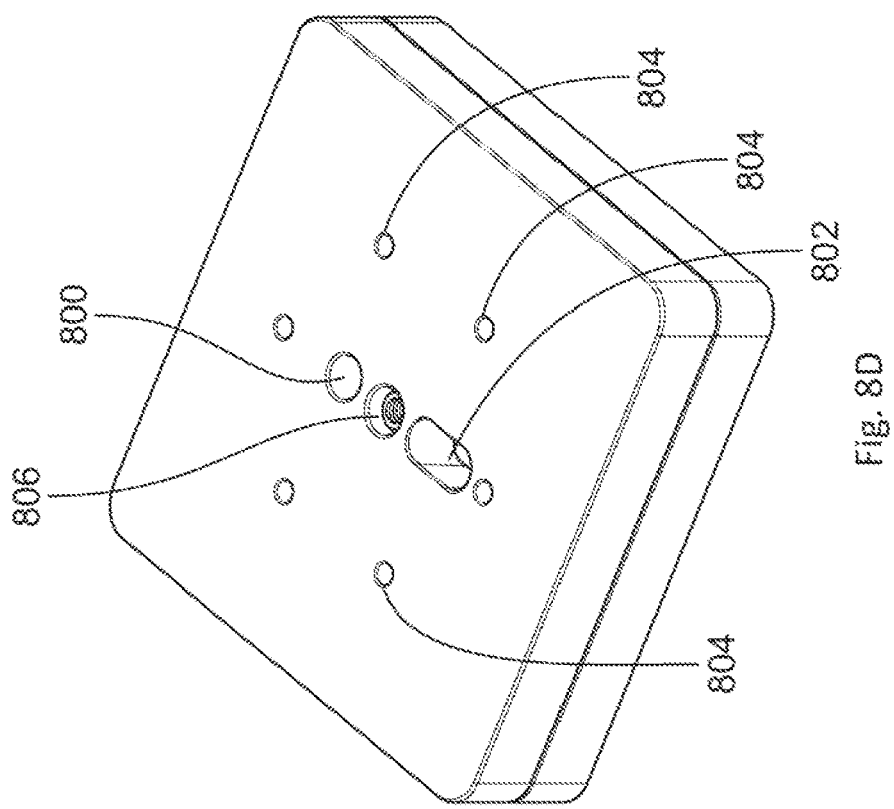
Figure 8C:
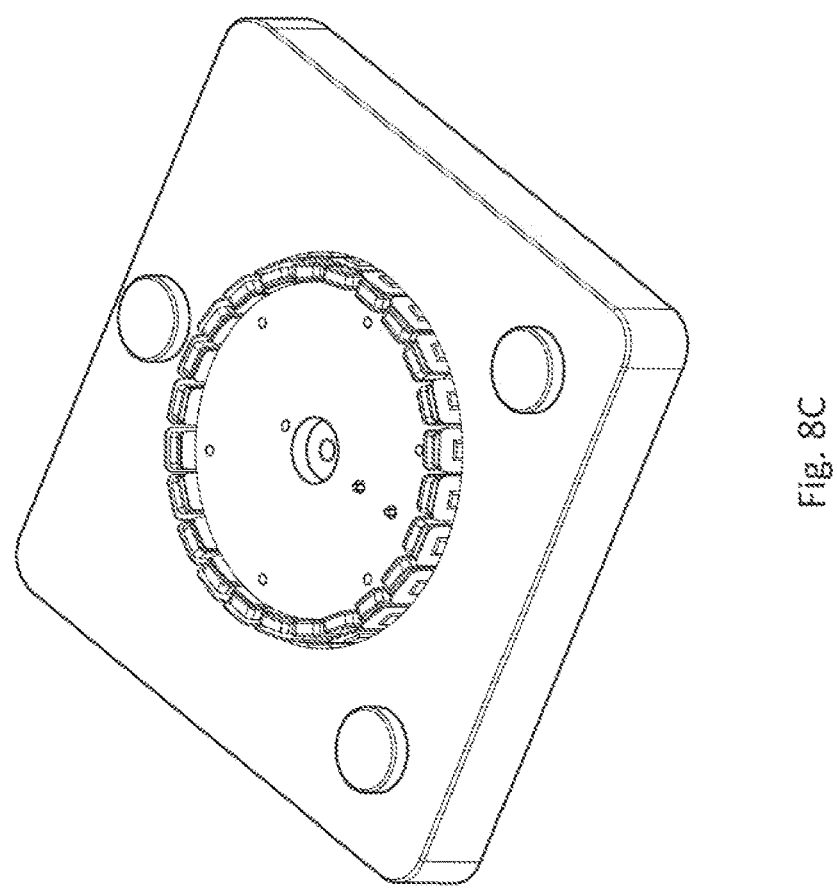
Figure 8F:
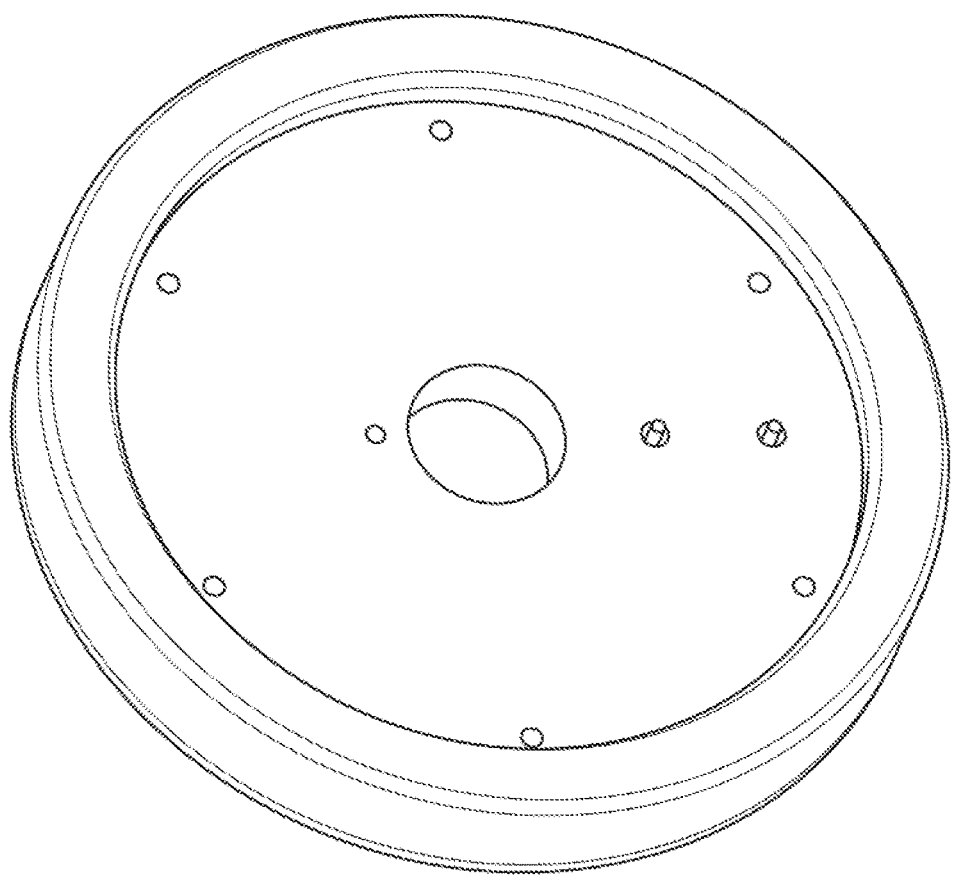

Depending on the type of sensor and the application, it may be useful to pot the rotary transformer and RF windings of the communication link. Potting improves heat transfer, reduces noise and vibrations, and can improve reliability by protecting the windings/coils. FIGS. 8A-F illustrate an exemplary potting technique. In particular. FIGS. 8A-B illustrate respective upper and lower halves of a potting mold. Prior to insertion of the assembled core, the facing surfaces of the mold may be sprayed or coated with a mold release for ease of disassembly. Then, the core is placed in the lower half of the mold as shown in FIG. 8C. Next, the upper half of the mold is affixed to the lower half as shown in FIG. 8D. The upper half of the mold includes a number of holes so that the various wires can extend out from the mold. These include a first hole 800 arranged to receive the communication link wire, a second hole 802 arranged to receive the ends of the wire for the transformer, and a series of holes 804 adapted to receive the ends of the motor wires. A central receptacle 806 is used to fasten the upper and lower halves together, e.g., with a screw or other fastening mechanism.

Figure 8E:
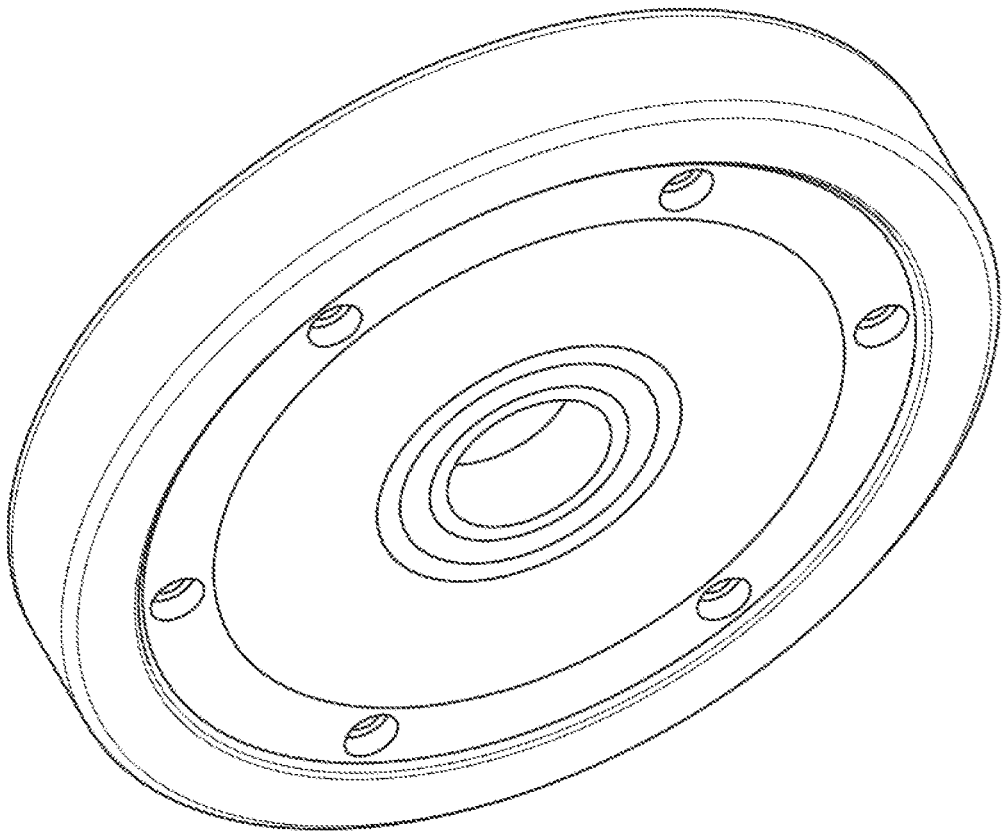

Once the mold is secured with the ends of the wires extending through the holes, the potting compound fills the mold. Various potting compounds, such as epoxy resins, may be employed, so long as they are non-corrosive to the wiring, have adequate heat transfer properties and are electrically insulating. Low temperature plastic overmolding may also be employed. After the potting compound has cured, the potted core is removed from the mold. Front and rear views of an exemplary potted core are shown in FIGS. 8E and F, respectively. At this point, any extra potting material may be trimmed as necessary.

After potting, magnetic field sensors such as Hall Effect or other sensors (e.g., magnetoresistive (MR) or giant magnetoresistive (GMR) sensors) are connected to the stator assembly as shown in FIG. 9. Here, printed circuit board (PCB) 900 and Hall Effect sensor elements 902 are shown. By way of example, the Hall Effect sensor elements 902 may be digital sensors or 3 axis analog sensors (with a D/A converter). The PCB 900 may be configured to include motor and transformer controllers (not shown), which may comprise integrated circuits housing one or more processors. ASIC or other hardware-based logic devices. Other components, such as surface mounted temperature sensors (not shown), may also be arranged on the PCB 900, e.g., to overly a motor trace to obtain motor temperature measurements. Similarly, a temperature sensor may be placed on the PCB adjacent to the transformer in order to monitor its temperature.

Figure 10B:
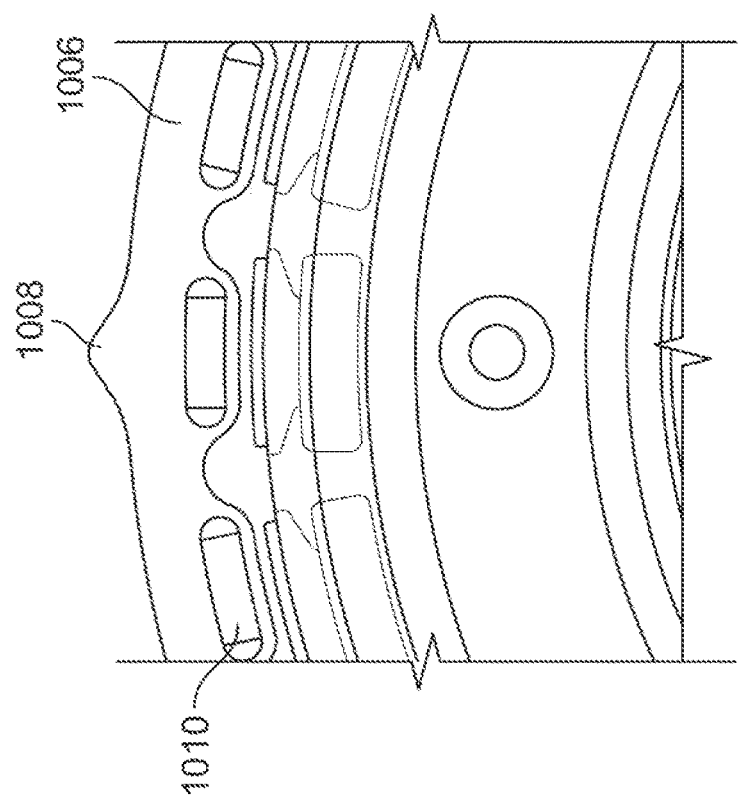
FIGS. 10A-B illustrate a stator-rotor assembly in accordance with aspects of the disclosure.
Figure 10A:
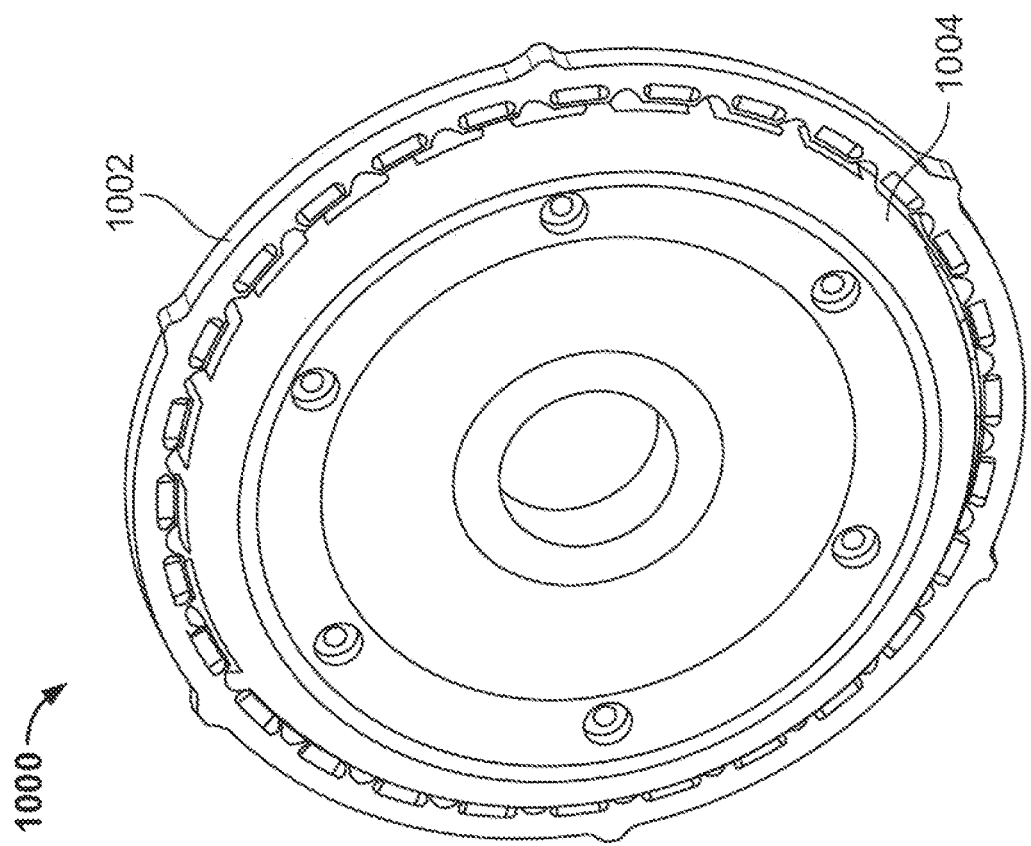

One example of a stator-rotor assembly 1000 is shown in FIG. 10A, with rotor 1002 encircling stator 1004. FIG. 10B is an enlarged partial view of the assembly 1000 including rotor backiron 1006, which has a generally circular arrangement. However, as shown in the figures, the backiron 1006 includes at least one protrusion 1008, for keying the rotor 1002. For instance, the protrusion(s) 1008 can be used to align the rotor in a rotor housing (not shown) of the rotating sensor assembly. This arrangement may be used for certain rotating sensors having a radial flux. Other configurations for rotating sensors with axial flux need not employ the keying feature. The rotor backiron 1006 also includes a series of magnets 1010 arranged to face the wound motor bobbins of the stator 1004.

In one example, the rotor 1002 can be made from a unitary piece of steel or a steel laminate. The rotor magnets 1010 could be, e.g., Neodymium iron (NdFe), samarium-cobalt (SmCo), a hard ferrite or other magnetic material. The rotor magnets 1010 are desirably located internally along the backiron 1006 as shown in FIG. 10B for ease of assembly without gluing. This approach also helps to reduce the airgap flux density for the stator core.

The stator-rotor assembly 1000 is configured to transfer power, torque and data (e.g., via RF communication between 2-50 MHz, or more or less) with the structures described above. The shared magnetic core provides the foundation for a simplified, efficient and powerful configuration that can be employed with various types of rotating sensors, including lidar, radar, optical or infrared cameras, etc.

Unless otherwise stated, the foregoing examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An assembly, comprising:
   a motor unit operatively coupled to a sensor unit, the motor unit including a ferrous stator and a rotor, the rotor being configured to rotate about an axis, the stator having a plurality of teeth arranged along an edge thereof;
   wherein a first section of the stator includes a rotary transformer coil disposed thereon, and a second section of the stator includes a radio frequency (RF) communication element disposed thereon; and
   wherein the motor unit is configured to rotate the sensor unit about the axis and the RF communication element is configured to transmit or receive RF signals used for data communication by the sensor unit.

2. The assembly of claim 1, wherein:
   the stator has a central opening aligned along the axis; and
   the edge is an exterior edge in which the plurality of teeth is disposed opposite the central opening.

3. The assembly of claim 2, wherein the RF communication element is disposed along the second section of the stator adjacent to the central opening.

4. The assembly of claim 3, wherein the RF communication element comprises a wire coiled between 1-3 turns adjacent to the central opening.

5. The assembly of claim 1, wherein the rotor encircles the stator.

6. The assembly of claim 1, further comprising one or more magnetic sensors affixed to the stator.

7. The assembly of claim 6, wherein the one or more magnetic sensors are digital sensors.

8. The assembly of claim 6, wherein the one or more magnetic sensors are 3 axis analog sensors.

9. The assembly of claim 1, wherein the stator is formed as a unitary ferrite molded element.

10. The assembly of claim 1, wherein the stator has a central opening and an exterior edge opposite the central opening, and the stator includes a receptacle region arranged between the central opening and the exterior edge.

11. The assembly of claim 10, wherein the rotary transformer coil is disposed in the receptacle region.

12. The assembly of claim 1, further comprising the sensor unit.

13. The assembly of claim 12, wherein the sensor unit is a lidar sensor unit.

14. The assembly of claim 12, wherein the sensor unit is a radar sensor unit.

15. The assembly of claim 12, wherein the sensor unit is a camera sensor unit.

16. The assembly of claim 1, wherein the assembly is configured to provide to the sensor unit.

17. The assembly of claim 1, further comprising a temperature sensor configured to obtain temperature measurements of the motor.

18. The assembly of claim 1, further comprising a temperature sensor configured to obtain temperature measurements of the rotary transformer coil.

19. A method of fabricating an assembly, the method comprising:
   forming a stator and transformer assembly from a ferromagnetic material, the stator and transformer assembly having a central opening, a plurality of teeth arranged along an exterior edge opposite the central opening;
   applying a set of bobbin assemblies to at least one set of the plurality of teeth, each of the plurality of the teeth in the at least one set receiving one of the set of bobbin assemblies;

disposing a transformer along one section of the stator and transformer assembly, the transformer configured to supply power to a rotatable electronic circuit; and disposing a communication link component adjacent to the central opening, the communication link component being configured to transmit or receive radio frequency (RF) signals used for data communication with the rotatable electronic circuit.

20. The method of claim 19, further comprising:

potting the assembly with a potting compound;

affixing one or more magnetic field sensors adjacent to one or more of the plurality of teeth; and encircling the assembly with a rotor configured to rotate about an axis relative to the assembly.

* * * * *